United States Patent
Kawashima et al.

(10) Patent No.: US 6,291,870 B1
(45) Date of Patent: Sep. 18, 2001

(54) SEMICONDUCTOR DEVICE

(75) Inventors: Hiroshi Kawashima; Keiichi Yamada; Keiichi Higashitani, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/444,557

(22) Filed: Nov. 19, 1999

(30) Foreign Application Priority Data

Jun. 8, 1999 (JP) .................................................. 11-161251

(51) Int. Cl.$^7$ ............................. H01L 33/00; H01L 29/00
(52) U.S. Cl. .............................................. 257/510; 257/520
(58) Field of Search ................................. 257/758, 510, 257/520; 438/129, 424

(56) References Cited

U.S. PATENT DOCUMENTS 5,885,856 * 3/1999 Gilbert et al. .
6,211,050 * 4/2001 Wong .

FOREIGN PATENT DOCUMENTS 8-213396   8/1996   (JP) .
9-181159   7/1997   (JP) .

\* cited by examiner

*Primary Examiner*—Stephen D. Meier
(74) *Attorney, Agent, or Firm*—McDermott, Will & Emery

(57) ABSTRACT

A semiconductor device is implemented having dummy patterns arranged by designedly determining the ratio of area occupied by a protruded portion of an element formation region considering the deposited state of a buried insulating film which becomes an isolation insulating film. The ratio of area occupied by a protruded portion of a dummy pattern to a predetermined cell region is defined to be almost the same as the maximum or average value of ratios of areas occupied respectively by protruded element formation regions to a plurality of predetermined regions each including a plurality of predetermined cell regions.

36 Claims, 10 Drawing Sheets

SEMICONDUCTOR DEVICE

BACKGROUND OF THE INVENTION

1. Field of the Invention

The present invention relates generally to semiconductor devices, and particularly to a semiconductor device having a dummy pattern which functions as a pattern for preventing an element formation region from being polished in the process of chemical-mechanical polishing an isolation insulating film.

2. Description of the Background Art

In order to avoid a problem which arises in a CMP (Chemical Mechanical Polishing) process that the flatness of an isolation insulating film in an element isolation region is degraded due to nonuniformity in density of patterns of element formation regions to be produced, a semiconductor device having a dummy pattern arranged in the element isolation region has conventionally been produced. Japanese Patent Laying-Open No 8-213396, for example, discloses an example of the dummy pattern in an interconnect layer, and Japanese Patent Laying-Open No. 9-181159 discloses an example of the dummy pattern used when STI (Shallow Trench Isolation) scheme is employed for isolating an element formation region pattern.

In the semiconductor devices of recent years, all elements are isolated from each other according to STI for simplification of the manufacturing process. Referring to FIG. 17, the region where an element formation region pattern 104 is not produced, that is, an element isolation region 103 thus occupies a considerably large area relative to element formation region pattern 104. In such a state, if a film 102 which becomes an isolation insulating film is deposited on a semiconductor substrate 101 and CMP is applied thereto, the finally produced surface of an isolation insulating film 102a formed in a large element isolation region 103a has an appreciably large depression as shown in FIG. 18, compared with an isolation insulating film 102b formed in a small element isolation region 103b. A scheme devised for preventing such a large depression in the surface of the isolation insulating film is to provide a dummy pattern 105 in large element isolation region 103a before depositing film 102 which becomes the isolation insulating film, and then carry out CMP as shown in FIG. 19. According to this scheme, the surface of isolation insulating film 102a left in large element isolation region 103a does not have such a large depression after CMP as shown in FIG. 20. As a result, in the state shown in FIG. 20 generated by providing dummy pattern 105 and then performing CMP, the flatness of the surface of isolation insulating film 102a formed in large element isolation region 103a is improved compared with the state of FIG. 18 generated by performing CMP without forming dummy pattern 105.

Even if the dummy pattern is formed in the element isolation region as described above, the improvement above may not be accomplished when the ratio of a two-dimensional area occupied by protruded element formation region patterns to the entire semiconductor chip region, that is, density of the element formation region patterns in the surface, and the ratio of a two-dimensional area occupied by protruded dummy patterns, that is, density of the dummy patterns in the surface considerably vary depending on the part of the entire semiconductor chip. In this case, the partial difference between the ratio of the area occupied by the element formation region patterns and that occupied by the dummy patterns could lead to difference in polishing rate by a CMP polishing cloth depending on respective parts of the chip. For example, if dummy patterns which occupy a small area and thus cause a high polishing rate are arranged, the region where such dummy patterns are provided is excessively polished. This is because the thickness of the remaining insulating film after polishing is determined according to the ratio of the area occupied by the element formation region patterns and that occupied by the dummy patterns if the polishing time is the same as shown in FIG. 21. Particularly, if the ratio of the area occupied by the element formation region patterns and that occupied by the dummy patterns are different by 20% in each part of the semiconductor substrate, a step of significance (significant step) of at least 500 Å is generated in the isolation insulating film after polishing. Such a significant step could considerably degrade the size controllability of the gate electrode or the like fabricated in a process after CMP.

A method for avoiding generation of the significant step is to set the proportion of the ratio of the area occupied by the element formation region patterns to that occupied by the dummy patterns at a predetermined value.

However, even if the proportion of the ratio of the area occupied by the element formation region patterns to that by the dummy patterns is set at a predetermined value, no consideration is given to the difference of the deposited state of the insulating film caused by the difference of the method of depositing the insulating film on the element formation region patterns and dummy patterns. Therefore, the flatness of the insulating film after CMP could partially be different depending on the deposition method of the insulating film.

In the manufacturing process of the semiconductor device, after the element isolation insulating film is formed by providing the dummy pattern and then performing CMP, a step of forming a gate electrode which connects the element formation region patterns to each other and a step of injecting impurities into the element formation region patterns are required. In these process steps, if the gate electrode is formed in contact with a dummy pattern having impurities, the dummy pattern electrically influenced by the gate electrode could electrically influence the element formation region patterns.

Further, if a dummy pattern is formed in an impurity diffusion region such as the region on the boundary between wells and an interconnect layer passes over the boundary, an unfavorable phenomenon of latchup could occur at the boundary of the wells.

A mask should be prepared such that dummy patterns are arranged by taking into consideration all the various conditions as discussed above. There is accordingly a demand for introduction of a technique of automatically determining the arrangement of dummy patterns by the CAD process to facilitate designing.

SUMMARY OF THE INVENTION

One object of the present invention is to provide a semiconductor device having a dummy pattern which is arranged designedly by determining the proportion of area occupied by the dummy pattern to area occupied by an element formation region pattern in consideration of a method of depositing an insulating film or the like.

A semiconductor device according to the present invention includes an element formation region pattern formed at a semiconductor substrate to be isolated by an element isolation region, and a dummy pattern formed in the element isolation region. The proportion between the ratio of area occupied by a protruded portion of the element formation region pattern to a predetermined region and the ratio of area occupied by a protruded portion of the dummy pattern to one of a plurality of predetermined cell regions which constitute the predetermined region is defined at a predetermined value.

The ratio of area occupied by the protruded portion of the element formation region pattern is herein defined as a value determined by dividing a region which is obtained by extending or decreasing each element formation region pattern by a predetermined distance by the area of the predetermined region. Specifically, if a buried insulating film is deposited to cover the element formation region pattern and the dummy pattern such that a side surface of a protruded portion of the buried insulating film is at 45° to the horizontal, the ratio of area occupied by the protruded portion of the element formation region pattern is determined by dividing the area of a region obtained by decreasing the element formation region pattern in plan view by a predetermined distance from the outer periphery thereof by the area of the predetermined region. If the buried insulating film is deposited in conformal manner, the ratio of area occupied by the protruded portion of the element formation region pattern is determined by dividing the area of a region obtained by extending the element formation region pattern in plan view by a predetermined distance from the outer periphery thereof by the area of the predetermined region.

The ratio of area occupied by the protruded portion of the dummy pattern is herein defined as a value obtained by dividing a two-dimensional region occupied by each dummy pattern which is extended or decreased by a predetermined distance by the area of the predetermined cell region. Specifically, if the buried insulating film is deposited such that the side surface of the protruded portion thereof is at 45° to the horizontal, the ratio of area occupied by the protruded portion of the dummy pattern is determined by dividing the area of a region obtained by decreasing the dummy pattern in plan view by a predetermined distance from the outer periphery thereof by the area of the predetermined cell region. If the buried insulating film is deposited in a conformal manner, the ratio of area occupied by the protruded portion of the dummy pattern is determined by dividing a region obtained by extending the dummy pattern in plan view by a predetermined distance from the outer periphery by the area of the predetermined cell region.

According to such an arrangement described above, if there are a plurality of predetermined regions each having a plurality of cells, for example, the ratio of area occupied by the protruded portion of the dummy pattern could be set at almost the same value as an average value of ratios of areas occupied by respective element formation region patterns to respective predetermined regions. If the protruded portion of the buried insulating film formed on the element formation region pattern and the dummy pattern is generated such that its side surface is at 45° to the horizontal, there is much variation in each of the ratios of areas occupied by the protruded portions of the element formation region pattern and the dummy pattern. It is accordingly possible to efficiently prevent occurrence of the step of significance after the CMP process by forming a dummy pattern at a ratio corresponding to the average value of the ratios of areas occupied by protruded portions of element formation region patterns to respective predetermined regions.

It would be possible to set the ratio of area occupied by the protruded portion of the dummy pattern at a value which is almost the same as the highest ratio of area occupied by the protruded portion of the element formation region pattern to any predetermined region, for example, the ratio of area occupied by the protruded portion of the element formation region pattern to a memory cell region. By such a setting, generation of a step of significance after the CMP process can efficiently be prevented by producing a dummy pattern at a ratio of area occupied by the protruded portion which is almost the same as the highest ratio to the predetermined region. The reason is that if the buried insulating film is formed in conformal manner on the element formation region pattern and the dummy pattern, that is, if the insulating film is formed in parallel with the uneven surface of the element formation region pattern, the ratio of area occupied by the protruded portion of the buried insulating film formed on the element formation region pattern and the dummy pattern is high in much of the predetermined regions.

Preferably, the almost the same value is set within a range from 80% to 120% in the semiconductor device according to the invention.

According to such an arrangement, it can easily be prevented that a step of at least 500 Å remains after performing CMP due to difference by at least 20% in the ratios of areas occupied by the protruded portions between element formation region pattern and dummy pattern. In other words, a step of significance can easily be prevented from being left. As a result, the yield of the semiconductor device is improved since the accuracy of size controllability in process steps following formation of an isolation insulating film is enhanced.

In the semiconductor device according to the invention, among a plurality of predetermined regions, any region where the ratio of area occupied by the protruded portion of the element formation region is highest may be a memory cell region.

The ratio of area occupied by the element formation region pattern is generally highest in the memory cell region. If the buried insulating film is deposited in conformal manner in the step of performing CMP to form an isolation insulating film, the advantage that generation of a step of significance after the CMP process can effectively be avoided would be derived sufficiently according to the arrangement above.

In the semiconductor device according to the invention, a dummy pattern formed in one predetermined cell region may include at least one rectangle.

The rectangle allows the amount of data to be minimum and also allows the process such as calculation of the area to be easy. Therefore, the calculation of the ratio of area occupied by the protruded portion of the dummy pattern becomes simpler. Owing to such an arrangement above, design is simply done when dummy patterns are globally arranged using CAD (Calculation Automatic Design) or the like.

More preferably, in the semiconductor device according to the invention, a dummy pattern located at the boundary between impurity diffusion regions of different conductivity types is removed.

If an interconnect layer or the like passes over a dummy pattern located on the boundary between impurity diffusion regions, electrical influence is exerted by the interconnect layer or the like on the dummy pattern located on the boundary between impurity diffusion regions, causing latchup phenomenon between impurity diffusion regions of different conductivity types. According to the arrangement above, the latchup phenomenon can be prevented and accordingly malfunction of the semiconductor device can be avoided.

More preferably, in the semiconductor device according to the invention, a dummy pattern located within a predetermined distance from a predetermined conductive layer is removed.

According to such an arrangement, no dummy pattern is placed in a region where there is a high possibility of being influenced by the conductive layer. As a result, the electrical influence exerted by the conductive layer via a dummy pattern containing impurities on an element such as a transistor can easily be avoided, and malfunction or the like of the semiconductor device can be prevented.

In the semiconductor device according to the invention, a dummy pattern may be formed by etching a semiconductor substrate such that a main surface of the semiconductor substrate remains as the dummy pattern.

According to such an arrangement, the element formation region pattern and the dummy pattern can be fabricated by trench isolation.

Therefore, the dummy pattern can be formed in the same mask as the one where an original element formation region pattern is formed, and thus the original element formation region pattern and the dummy pattern can simultaneously be formed in one step. Then the manufacturing process of the semiconductor device can be shortened.

More preferably, in the semiconductor device according to the invention, in a region located at 50 µm or less in plan view from the periphery of an alignment mark, the ratio of area occupied by the protruded portion of the dummy pattern to a predetermined cell region is made lower by at least 20% than that in a region other than the region located at 50 µm or less in plan view from the periphery of the alignment mark.

According to such an arrangement, the density of dummy patterns is low only in the vicinity of the alignment mark. Therefore, if the alignment accuracy is tested using light having a long exposure wavelength, the dummy pattern would not erroneously be detected and thus the step of the alignment mark can easily be detected. Accordingly, the alignment accuracy is enhanced.

The semiconductor device according to the invention may further include a conductive layer formed on the element formation region pattern and a dummy conductive layer formed on the dummy pattern with the same material and thickness as the conductive layer.

According to such an arrangement, conductive layers that are the same as a gate electrode are almost uniformly arranged on the semiconductor substrate surface. Therefore, etching can be conducted in uniformly distributed etching gas. The accuracy of etching for forming the gate electrode is thus improved. Dummy conductive layers are regularly arranged to have almost the same ratio of area occupied by the dummy conductive layers. Therefore, in a step of polishing an interlayer insulating film after a step of forming the interlayer insulating film to cover the gate electrode and the dummy conductive layers, the flatness of the interlayer insulating layer after the polishing step can be improved as accomplished by the dummy pattern which improves the flatness of the isolation insulating film surrounding the element formation region pattern.

In the semiconductor device according to the invention, a first conductive layer formed at a main surface of the dummy pattern and a second conductive layer formed at a main surface of the element formation region pattern in the same well may be connected electrically by the well such that the first and second conductive layers are at the same potential.

According to such an arrangement, the surface of the dummy pattern can be fixed at the same potential as that of an impurity diffusion region such as the well, for example. Consequently, it is possible to prevent the latchup phenomenon which causes current to flow through a PN junction at a boundary between wells of different conductivity types due to the potential difference between the PN junction surface portion and any other portion in the well. Such a well region can be produced just by forming an opening at the same mask as that for injecting impurities to generate a PN junction when the source/drain region is formed. Accordingly, the number of manufacturing process steps does not increase.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in conjunction with the drawings.

First Embodiment

A semiconductor device having a dummy pattern according to the first embodiment is now described with reference to FIGS. 1 to 12. In the semiconductor device having a dummy pattern in this embodiment, a trench which becomes an element isolation region 3 is formed to produce an isolated element formation region pattern 4, a buried oxide film 2 which becomes an isolation insulating film is deposited to cover element formation region pattern 4 and element isolation region 3, and thereafter buried oxide film 2 is polished by CMP to produce the isolation insulating film as shown in FIGS. 1 and 2.

Figure 1:
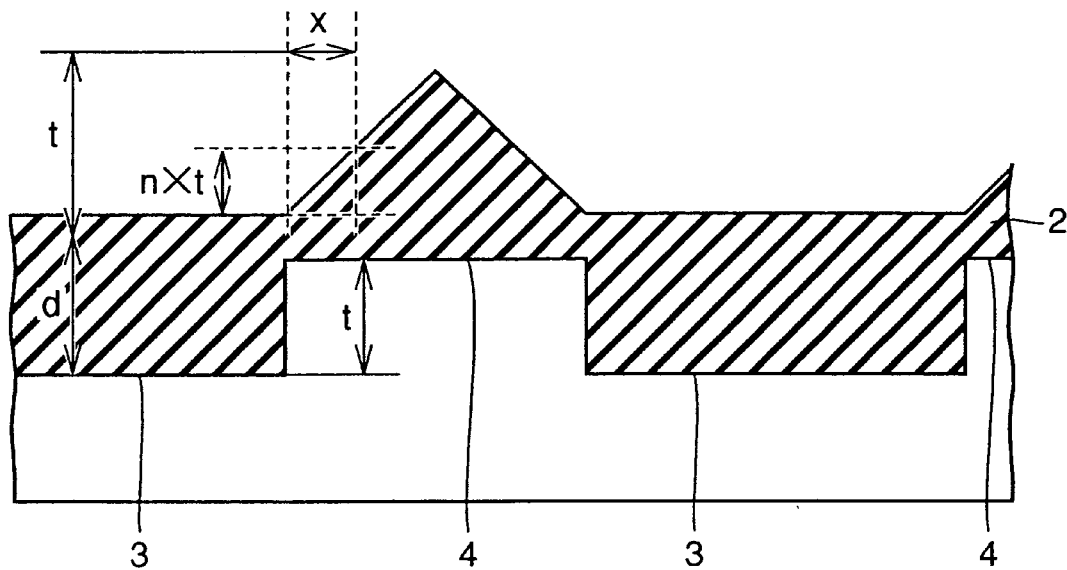
FIG. 1 illustrates a buried oxide film which is formed, like an oxide film deposited by an HDP-CVD apparatus, by repeatedly conducting etching and deposition processes such that a side surface of a protruded portion on a protruded portion formed by an element formation region pattern is at 45° to the horizontal, in a semiconductor device according to the first embodiment.
Figure 2:
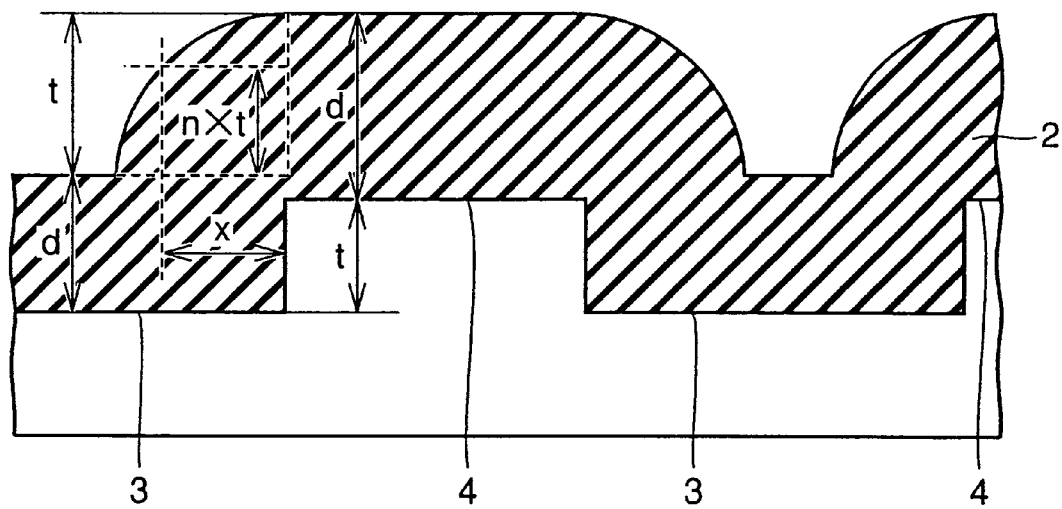
FIG. 2 illustrates a buried oxide film which is deposited, like a TEOS oxide film deposited by a plasma CVD apparatus, in conformal manner according to unevenness, in a semiconductor device according to the first embodiment.

Description is first given on FIGS. 1 and 2. Referring to FIG. 1, buried oxide film 2 is deposited by repeating etching and deposition processes to cover element formation region pattern 4 and element isolation region 3 such that buried oxide film 2 has a protruded portion with its side surface at 450 to the horizontal on a protruded portion formed by element formation region pattern 4, like an oxide film deposited by an HDP (High Density Plasma)—CVD (Chemical Vapor Deposition) apparatus. Referring to FIG. 2, buried oxide film 2 is deposited in conformal manner relative to the unevenness of element formation region pattern 4, that is, buried oxide film 2 is deposited with a constant thickness along the unevenness of the surface of a semiconductor substrate 1 to cover element formation region pattern 4 and element isolation region 3, like a TEOS (Tetra Etyle Othro Silicate) oxide film deposited by a plasma CVD apparatus.

FIGS. 1 and 2 show a trench depth t, a thickness d of deposited buried oxide film 2, a sizing amount x corresponding to a predetermined dimension measured from the outer periphery of element formation region pattern 4 that is used to represent a portion of element formation region pattern 4 that is first brought into contact with the polishing cloth, and a coefficient n relative to trench depth t for calculating sizing amount x.

The ratio of area occupied by a protruded portion of a dummy pattern is described below. Referring to FIG. 1, if buried oxide film 2 is deposited such that its protruded portion has a side wall at 45° relative to the horizontal, sizing amount x is defined to be equal to t×n. Referring to FIG. 2, if buried oxide film 2 is deposited in conformal manner, sizing amount x is defined to be equal to t×Cos (Sin$^{-1}$ (n)). Although coefficient n varies depending on the polishing condition and film property, n is approximately 0.5 in general, and accordingly, 0.5 is used for calculation.

Here, the ratio of area occupied by a protruded portion of an element formation region pattern is defined as a value which is determined by dividing a region sized by x relative to each element formation region pattern 4 by a predetermined region, for example, the area of a memory cell region. Specifically, if buried oxide film 2 is deposited such that its protruded portion has a side surface at 45° to the horizontal as shown in FIG. 1, the area of a region reduced by x from the outer periphery of the element formation region pattern in plan view is divided by the area of the predetermined region so as to determine the ratio of area occupied by a protruded portion of an element formation region pattern. If buried oxide film 2 which becomes an isolation oxide film is deposited in conformal manner as shown in FIG. 2, the ratio of area occupied by a protruded portion of an element formation region pattern is defined as a value determined by dividing the area of a region increased by x from the outer periphery in plan view of the element formation region pattern by the area of the predetermined region.

Further, the ratio of area occupied by a protruded portion of a dummy pattern is defined as a value which is obtained by dividing a region sized by x relative to a two-dimensional region occupied by each dummy pattern 5 by a predetermined cell region. Specifically, if buried oxide film 2 is deposited such that its protruded portion has a side surface at 450 to the horizontal as shown in FIG. 1, the area of a region reduced by x from the outer periphery in plan view of dummy pattern 5 is divided by the area of a predetermined cell region to determine the ratio of area occupied by a protruded portion of a dummy pattern. If buried oxide film 2 is deposited in conformal manner as shown in FIG. 2, the area of a region increased by sizing amount x from the outer periphery in plan view of dummy pattern 5 is divided by the area of the predetermined cell region to determine the ratio of area occupied by a protruded portion of a dummy pattern.

As discussed above in relation with the conventional art, when buried oxide film 2 as shown in FIGS. 1 and 2 is polished by CMP to planarize the surface, if the ratio of area occupied by the protruded portion considerably varies from each part to each part over a large range of the chip, difference in surface pressure by the CMP polishing cloth causes difference in polishing rate, resulting in an absolute step at the isolation oxide film. In this case, if the ratio of area occupied by the protruded portion of the original element formation region pattern and that of the dummy pattern are different from each other by 20% or more in each part, a step of significance is produced. Therefore, the difference in the ratio of area occupied by the protruded portion between the element formation region pattern and the dummy pattern should be 20% or less. A design low and a structure of the semiconductor device in this embodiment having such a dummy pattern is next described.

Figure 3:
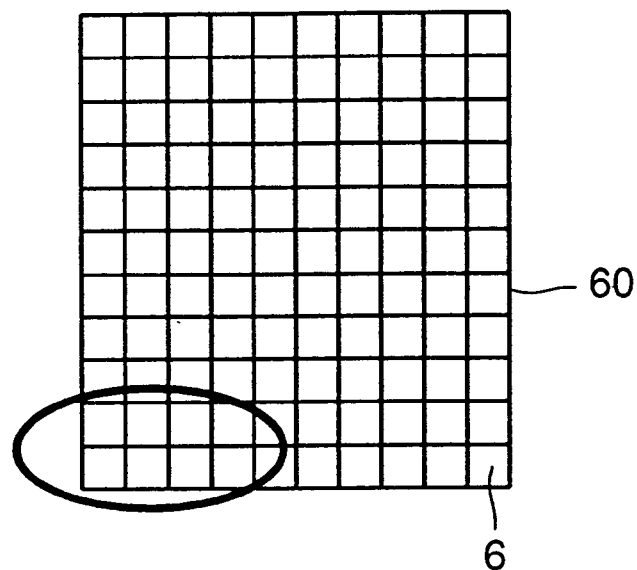
FIG. 3 illustrates a state in which dummy patterns are regularly arranged in a grid formed of lines perpendicular to each other in the semiconductor device according to the first embodiment.
Figure 4:
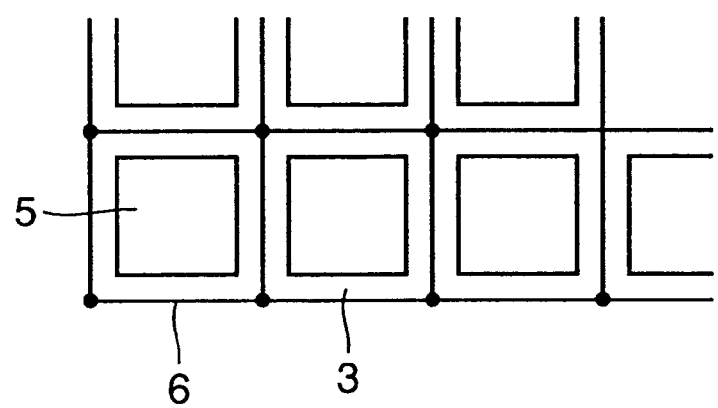
FIG. 4 illustrates a state in which a dummy pattern is arranged as a rectangle having the same center as that of a predetermined cell region in the semiconductor device according to the first embodiment.
Figure 5:
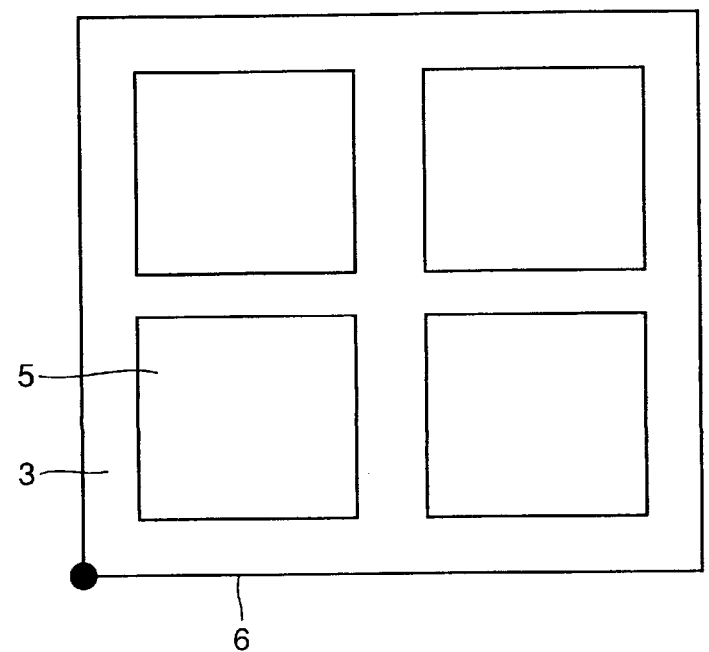
FIG. 5 illustrates one example of an arrangement of a plurality of rectangular dummy patters placed in a predetermined cell region in the semiconductor device according to the first embodiment.
Figure 6:
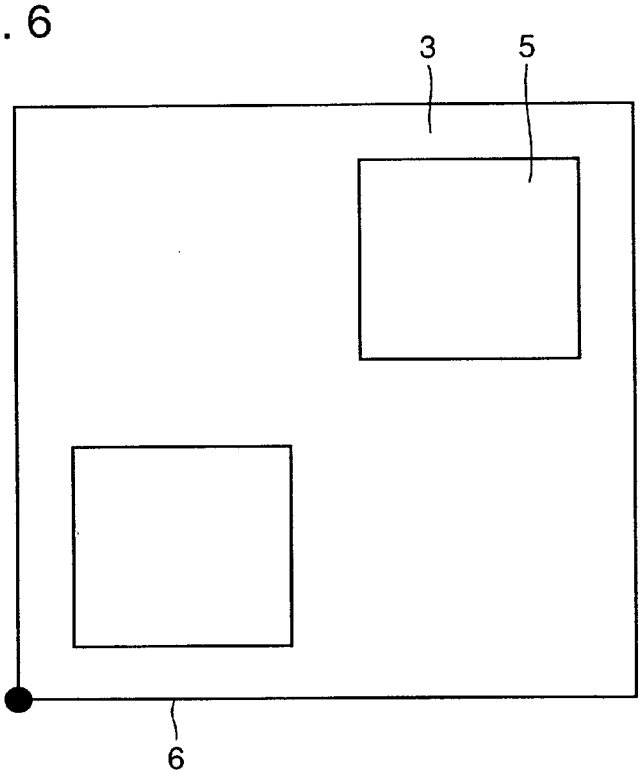
FIG. 6 illustrates another example of the arrangement of a plurality of rectangular dummy patterns placed in a predetermined cell region in the semiconductor device according to the first embodiment.
Figure 7:
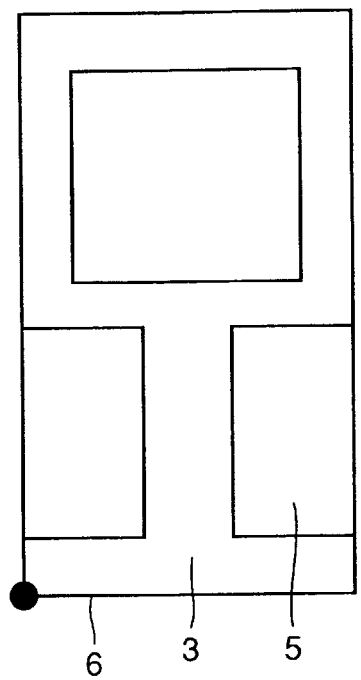
FIG. 7 illustrates still another example of the arrangement of a plurality of rectangular dummy patterns placed in a predetermined cell region in the semiconductor device according to the first embodiment.
Figure 8:
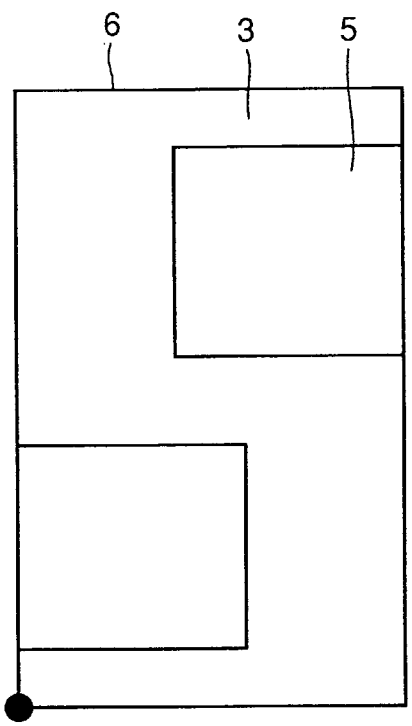
FIG. 8 illustrates a further example of the arrangement of a plurality of rectangular dummy patterns placed in a predetermined cell region in the semiconductor device according to the first embodiment.

Referring to FIG. 3, in the first stage of mask formation for designing he semiconductor device in this embodiment, a plurality of predetermined cell regions 6 separated from each other by a grid formed of orthogonal lines are arranged in a predetermined region 60. A dummy pattern 5 is placed in predetermined cell region 6. Each dummy pattern 5 in predetermined cell region 6 is shaped as a rectangle as shown by FIG. 4 that can be produced by 2 points on CAD data. The structure inside predetermined cell region 6 may be formed of a plurality of rectangles as shown in FIGS. 5 to 8.

Referring to FIGS. 9 to 12, flows of CAD for arranging the element formation region pattern, well, gate electrode, and the like in predetermined region 60 having a plurality of predetermined cell regions 6 where dummy patterns 5 are placed are described. It is noted that the step of forming an aluminum interconnect layer or the like is not mentioned here.

Figure 9:
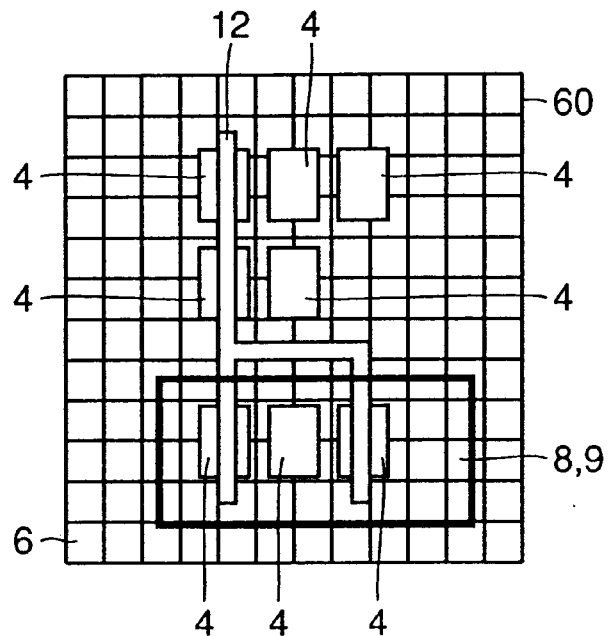
FIG. 9 illustrates CAD flow 1 for forming a mask to manufacture a semiconductor device having a dummy pattern in the first embodiment.

In flow 1, over the entire surface of predetermined region 60 which constitutes the semiconductor device, predetermined cell regions 6 having dummy patterns 5 are regularly arranged in the grid formed of orthogonal lines as shown in FIG. 4. A P well 8 or an N well 9 and element formation region pattern 4 are thereafter arranged in predetermined region 60 including a plurality of predetermined cell regions 6. Then, a gate electrode 12 is arranged over element formation region patterns 4 so as to connect a plurality of element formation region patterns 4 to each other, and thus the arrangement as shown is FIG. 9 is produced.

Figure 10:
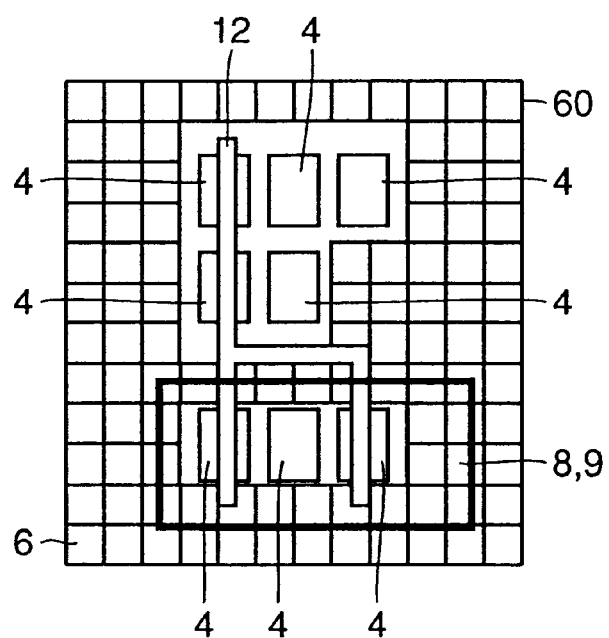
FIG. 10 illustrates CAD flow 2 for forming a mask to manufacture a semiconductor device having a dummy pattern in the first embodiment.
Figure 11:
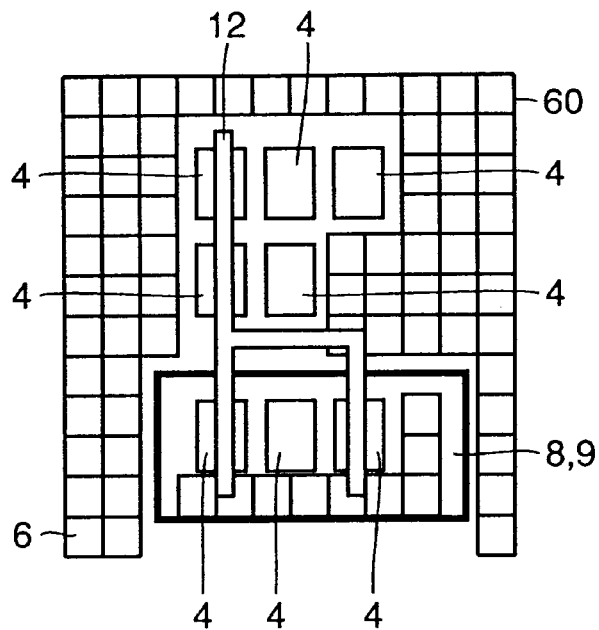
FIG. 11 illustrates CAD flow 3 for forming a mask to manufacture a semiconductor device having a dummy pattern in the first embodiment.
Figure 12:
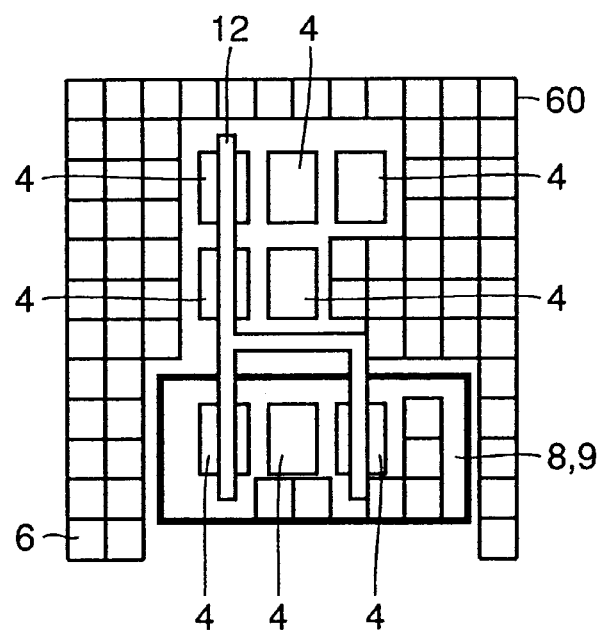
FIG. 12 illustrates CAD flow 4 for forming a mask to manufacture a semiconductor device having a dummy pattern in the first embodiment.

In flow 2, if any dummy pattern 5 is in contact with element formation region pattern 4 in plan view, that dummy pattern 5 within predetermined cell region 6 is removed as shown in FIG. 10. At this time, if element formation region pattern 4 is increased by a desired size, in other words, if element formation region pattern 4 is supposed to be slightly larger than the actual one, and then dummy pattern 5 in predetermined cell region 6 is accordingly removed, the isolation property between element formation region pattern 4 and dummy pattern 5 can be maintained enough in the semiconductor device.

In flow 3, if any predetermined cell region 6 crosses the boundary of P well region 8 or N well region 9, that dummy pattern 5 in predetermined cell region 6 is eliminated At this time, N well region 9 is increased and decreased by desired sizes respectively and AND process is applied to the resultant regions. Specifically, a portion slightly larger than the actual boundary of P well region 8 or N well region 9 is determined and a portion slightly smaller than that is determined, then a region where the inside of the former portion larger than the boundary and the outside of the latter portion smaller than the boundary overlap is determined and accordingly, any predetermined cell region 6 having dummy pattern 5 which crosses that overlap region is eliminated. Consequently, the isolation property of P well region 8 or N well region 9 can be ensured in the semiconductor device.

In flow 4, if any predetermined cell region 6 crosses the region where gate electrode 12 is formed, that dummy pattern 5 in predetermined cell region 6 is eliminated. At this time, if the region where gate electrode 12 is formed is also increased by a desired size and then dummy pattern 5 in predetermined cell region 6 is removed, it is possible to ensure margin relative to misalignment or the like, i.e. allowance on overlay error.

Predetermined cell regions 6 having dummy patterns 5 that are left after execution of flows 1 to 4 and desired element formation region pattern 4 are superimposed on each other to form opening patterns in the same mask. Using this mask, element formation region pattern 4 and dummy pattern 5 are formed in semiconductor substrate 1 by trench isolation.

It is noted the order of flows 2 to 4 is not fixed, and flow 3 and flow 4 may be omitted depending on the process. Further, elimination of dummy patterns 5 may be done after desirably sizing the regions where element formation region pattern 4, P well region 8 or N well region 9, and gate electrode 12 are formed, in other words, after adjusting the size of those regions. Then, respective patterns may be superimposed to simultaneously form opening patterns.

Following the design flows as described above, openings having those shapes are made in the mask for fabricating the semiconductor device with a dummy pattern. Then it is possible to globally arrange dummy patterns 5 using the lithography and etching arts in a region which is the element isolation region of the semiconductor device but which does not include the region where dummy pattern 5 should not be formed. As a result, arrangement of dummy patterns 5 for achieving the flatness can automatically be done by CAD or the like. The mask for fabricating the semiconductor device having dummy pattern 5 can thus be formed more easily.

Further, openings can simultaneously be formed in the same mask for generating original element formation region pattern 4 and dummy pattern 5, so that the manufacturing process of the semiconductor device can be shortened.

In addition, the dummy pattern is a rectangle in plan view, so that the ratio of area occupied by the protruded portion of the dummy pattern can be calculated easily. Consequently, design becomes simpler when dummy patterns are globally arranged using CAD or the like.

In the semiconductor device according to this embodiment, if there are a plurality of predetermined regions 60 each having a plurality of predetermined cell regions 6 as described above, the ratio of area occupied by a protruded portion of a dummy pattern can be set at a value which is almost equal to the average value of the respective ratios of areas occupied by element formation region patterns to respective predetermined regions. Then, if buried oxide film 2 formed on element formation region pattern 4 and dummy pattern 5 is deposited as shown in FIG. 1 such that its protruded portion has a side wall at an oblique angle of 45°, a part of the protruded portion that is first effectively brought into contact with the polishing cloth is smaller than the original pattern. In this case, the ratio of area occupied by the protruded portion considerably varies depending on the predetermined region. However, if dummy pattern 5 is formed such that the ratio of area occupied by the dummy pattern has the average value of the respective ratios of areas occupied by protruded element formation region patterns to respective predetermined regions 60, occurrence of the step of significance after execution of CMP can efficiently be prevented.

Further, the ratio of area occupied by a protruded portion of a dummy pattern can be set at almost the same value as that of the highest ratio of area occupied by a protruded portion of an element formation region pattern to any predetermined region 60, for example, in a memory cell region. If buried oxide film 2 is deposited in conformal manner on element formation region pattern 4 and dummy pattern 5 as shown in FIG. 2, that is, buried oxide film 2 is formed along the uneven surface of element formation region pattern 4 and element isolation region 3, the ratio of area occupied by a protruded portion which is formed on the element formation region pattern and is first effectively brought into contact with the polishing cloth is higher in all of the predetermined regions 60 than that of the original pattern. Accordingly, generation of the step of significance after CMP process can effectively be prevented by forming dummy pattern 5 such that the ratio of area occupied by a protruded portion of a dummy pattern is almost the same as the highest ratio to a predetermined region.

If the ratio of area occupied by a protruded portion of a dummy pattern is adjusted to be within the range from 80% to 120% of the ratio of area occupied by a protruded portion of an element formation region pattern, it is possible to prevent the significant step of at least 500 Å from being left after CMP. The significant step of at least 500 Å occurs when the ratio of area occupied by the protruded dummy pattern and that by the protruded element formation region pattern differ by at least 20%. Consequently, the accuracy of those steps following the step of forming buried oxide film is improved to enhance the yield of the semiconductor device.

As dummy pattern 5 located on the boundary of P well region 8 or N well region 9 where impurities are diffused is eliminated, it is possible to prevent latchup which causes electric current to flow through the PN junction surface between impurity diffusion regions of different conductivity types via dummy pattern 5 located on the boundary. Malfunction of the semiconductor device can be prevented accordingly.

As no dummy pattern 5 is located at a position which could highly possibly have electrical influence by a conductive layer such as gate electrode, electrical influence which is indirectly exerted by the conductive layer on any element such as the transistor via dummy pattern 5 can easily be prevented. Consequently, malfunction of the semiconductor device can be prevented.

Second Embodiment

A semiconductor device according to the second embodiment is now described. In the semiconductor device of this embodiment, the ratio of area occupied by a protruded portion of a dummy pattern located at least within 50 μm from the periphery of an alignment mark is made smaller by at least 20% than the ratio of area occupied by a protruded portion of a dummy pattern located over the entire predetermined region except the portion located at least 50 μm from the periphery of the alignment mark. In this case, although dishing, i.e. polishing is performed and recess or depression is generated in a region where the alignment mark and dummy patterns around the mark are located, such process does not influence the function of the alignment mark. It is noted that the ratio of area occupied by a protruded portion of a dummy pattern located around the alignment mark may be 0%, that is, there may be no dummy pattern. The alignment mark may be the one for inspecting the overlay accuracy.

According to such an arrangement, the ratio of area occupied by the dummy pattern is-small only in the vicinity of the alignment mark. Therefore, if the alignment accuracy is inspected using light with a long wavelength, there are few chances to erroneously detect the step formed by the dummy pattern instead of the step formed by the alignment mark. The step of the alignment mark can thus be detected easily. As a result, the overlay accuracy can be inspected more correctly using the alignment mark.

Third Embodiment

Figure 13:
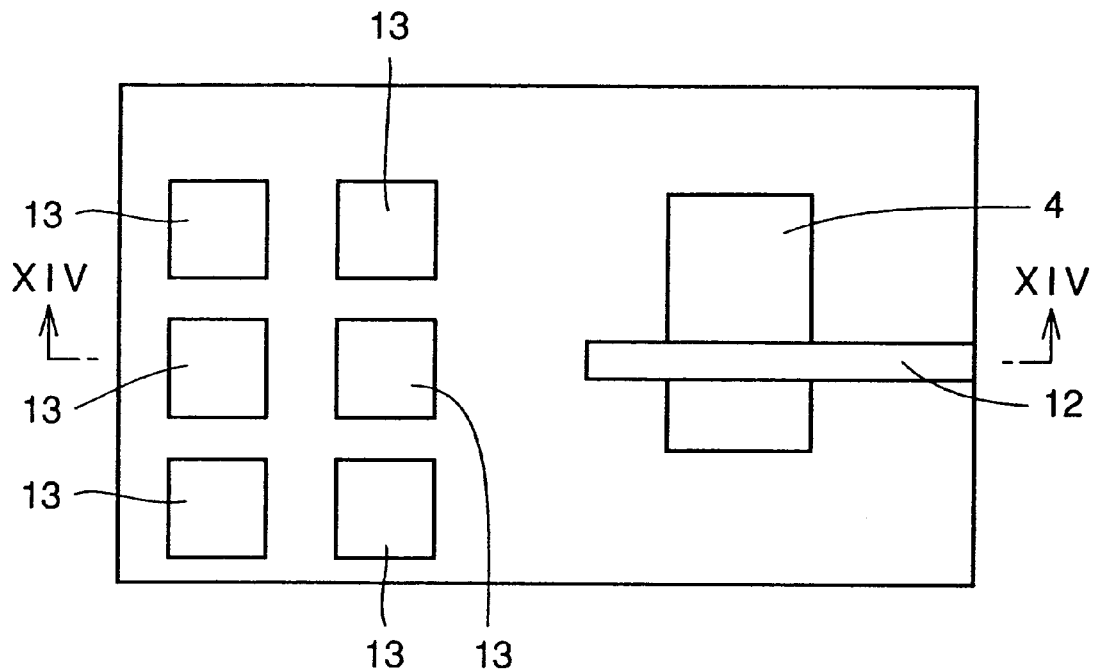
FIG. 13 is a plan view illustrating a gate electrode dummy pattern formed on a dummy pattern in a semiconductor device having the dummy pattern in the third embodiment.
Figure 14:
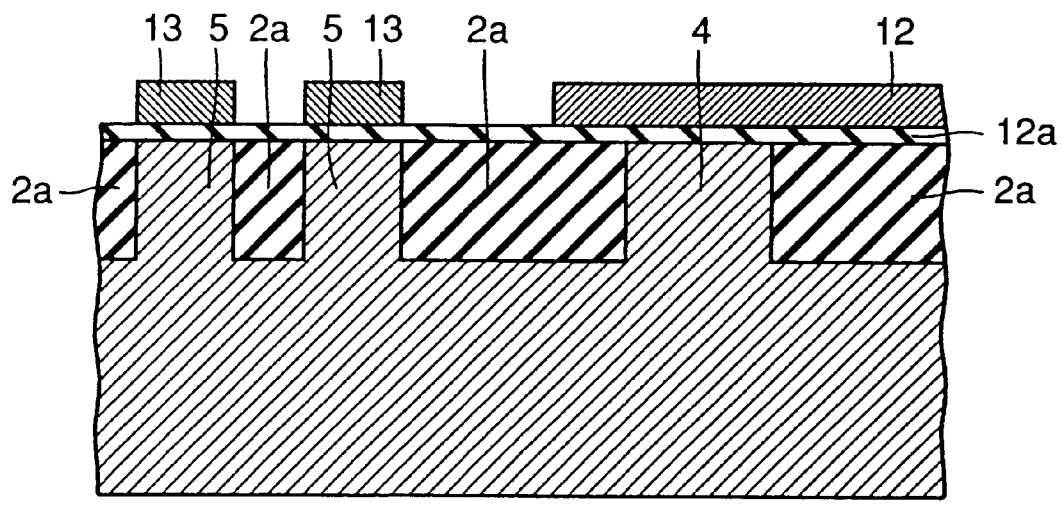
FIG. 14 is a cross sectional view along line A—A in FIG. 13 illustrating the gate electrode dummy pattern formed on the dummy pattern in the semiconductor device having the dummy pattern in the third embodiment.

A semiconductor device according to the third embodiment is described below in conjunction with FIGS. 13 and 14. In the semiconductor of this embodiment, an opening of a gate electrode dummy pattern 13 which has the same shape in plan view as an opening of a dummy pattern 5 is formed in a mask for fabricating a gate electrode 12. As shown in the plan view in FIG. 13 and the cross sectional view in FIG. 14, on a film 12a which becomes a gate insulating film which covers surfaces of an element formation region pattern 4, dummy pattern 5 and an isolation oxide film 2a, gate electrode 12 is formed and simultaneously gate electrode dummy pattern 13 is formed directly above dummy pattern 5.

According to such an arrangement, in the step of forming gate electrode 12, etching of a conductive layer to produce gate electrode 12 is applied not only to the portion to be formed into gate electrode 12 but to the entire surface of the semiconductor substrate in almost uniform manner. Consequently, the etching gas or the like is distributed almost uniformly to the entire surface of the semiconductor substrate, and thus the size controllability in the etching of gate electrode 12 is improved.

Further, gate electrode 12 and gate electrode dummy pattern 13 are formed in the same mask pattern, so that the CAD process has no additional load and enhancement in flatness of the surface of the interlayer insulating film as well as enhancement in size controllability for interconnect or the like formed on the interlayer insulating film can be achieved after the process of forming the gate electrode, as accomplished by the advantage of the dummy pattern in the first embodiment.

Fourth embodiment

Figure 15:
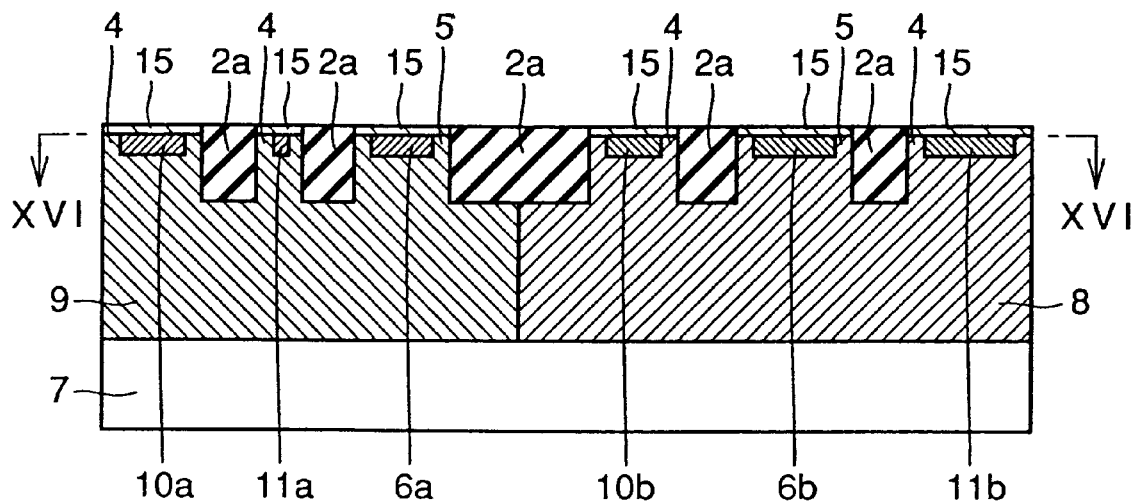
FIG. 15 is a cross sectional view along line C—C in FIG. 16 illustrating a dummy pattern formed in a well in a semiconductor device of a CMOS structure having the dummy pattern in the fourth embodiment.
Figure 16:
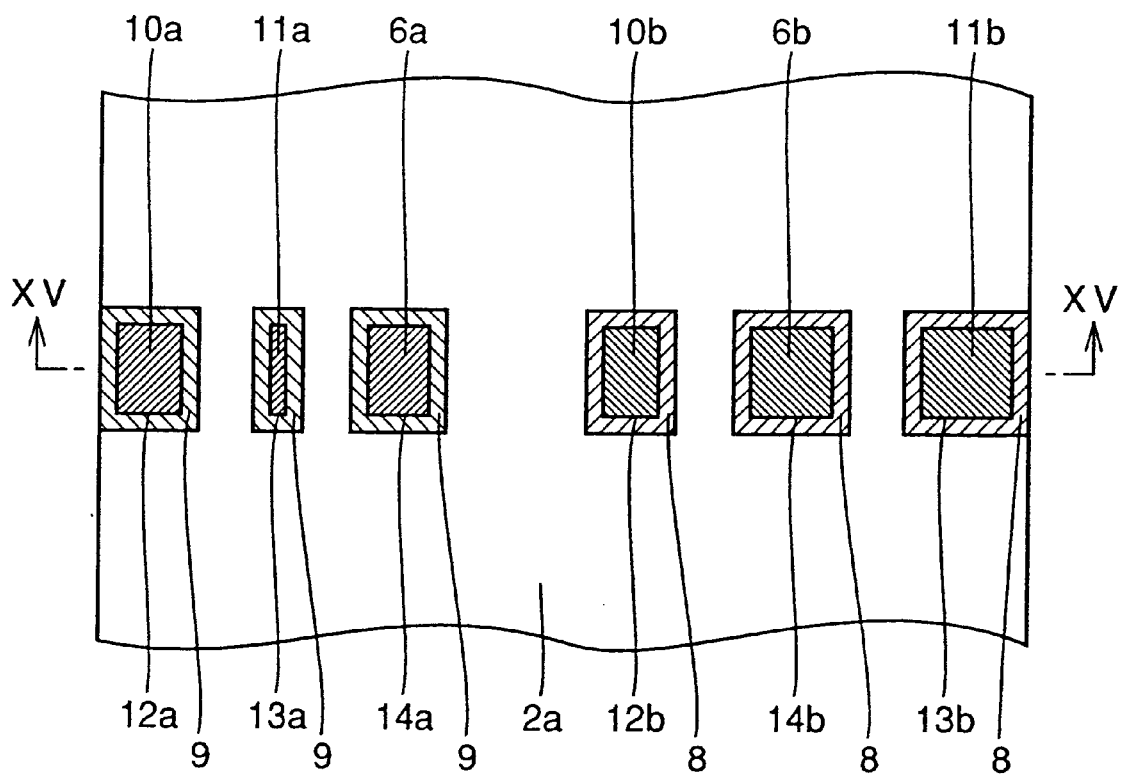
FIG. 16 is a cross sectional view along line B—B in FIG. 15 illustrating a plan view of an element formation region pattern and a dummy pattern when the dummy pattern is formed in a well in the semiconductor device of the CMOS structure having the dummy pattern in the fourth embodiment.
Figure 17:
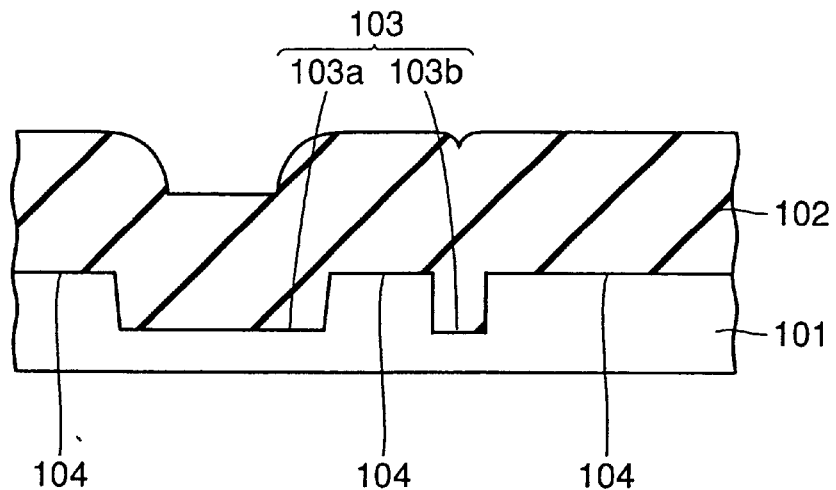
FIG. 17 is a cross sectional view illustrating an element formation region pattern and an element isolation region covered by an interlayer insulating film in a conventional semiconductor device having a large trench isolation region without a dummy pattern.
Figure 18:
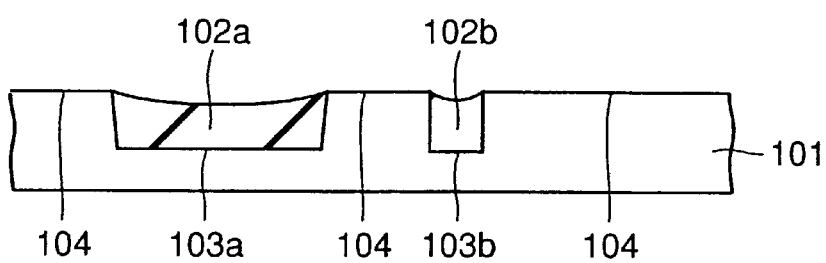
FIG. 18 illustrates a state immediately after a buried film which becomes an isolation insulating film is polished by CMP in the semiconductor device having a large trench isolation region without a dummy pattern.
Figure 19:
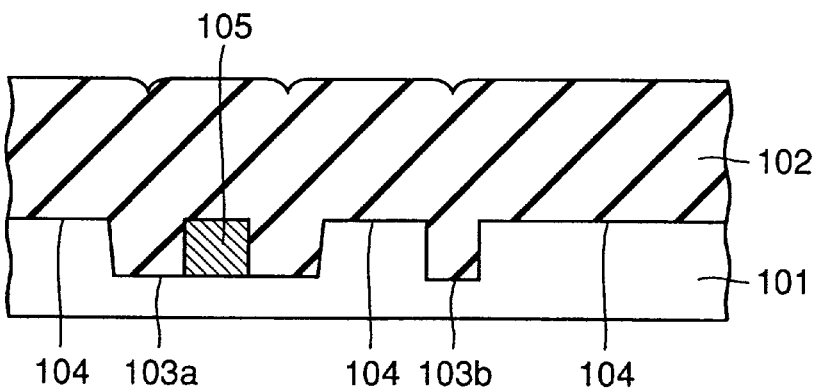
FIG. 19 is a cross sectional view illustrating an element formation region pattern and an element isolation region covered by a buried film which becomes an isolation insulating film in a conventional semiconductor device having a dummy pattern.
Figure 20:
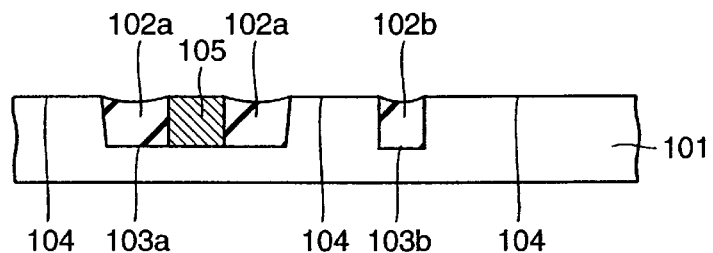
FIG. 20 illustrates a state immediately after a film which covers the element formation region pattern and the element isolation region to become an isolation insulating film is polished by CMP in the conventional semiconductor device having a dummy pattern.
Figure 21:
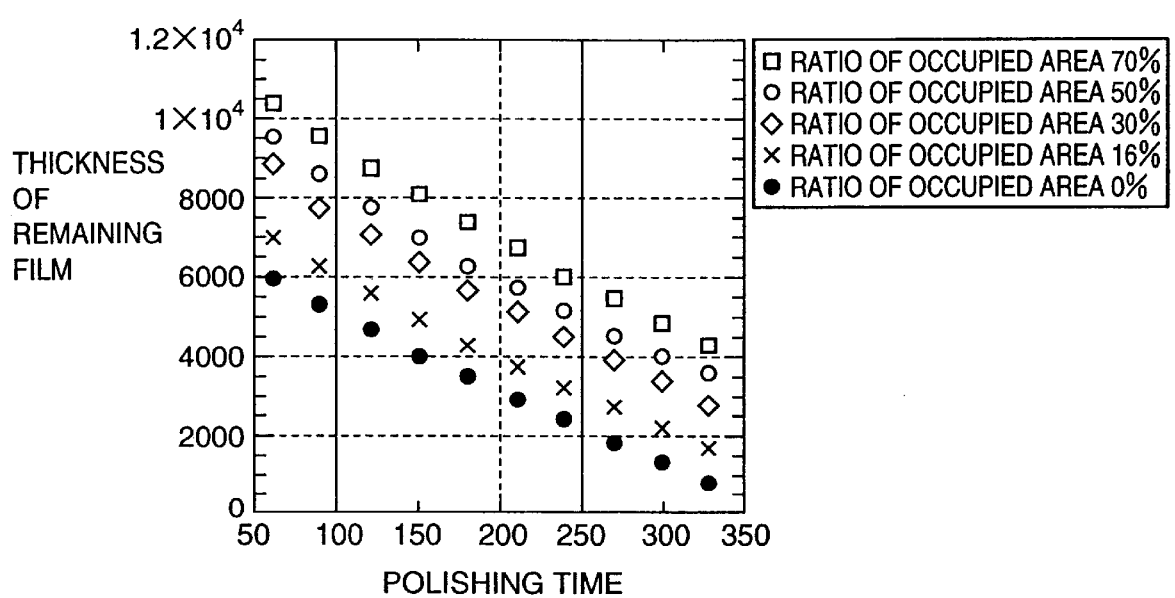
FIG. 21 is a graph illustrating a relation between the thickness of the remaining insulating film after polishing by CMP and the polishing time, for each ratio of area occupied by a protruded dummy pattern in the conventional dummy pattern semiconductor device.

A semiconductor device in the fourth embodiment is described below in conjunction with FIGS. 15 and 16. The semiconductor device of this embodiment has a CMOS structure in which an N well region 9 and a P well region 8 are formed on a P-type semiconductor substrate 7, and an element formation region pattern 4 and a dummy pattern 5 are formed in each of the well regions as shown in FIGS. 15 and 16. In portions from the upper surfaces of element formation region patterns 4 formed in N well region 9 and P well region 8 to a predetermined depth, $N^+$ diffusion regions 10a and 10b and $P^+$ diffusion regions 11a and 11b are formed respectively to constitute source and drain regions of transistor. Further, in a portion from the upper surface of dummy pattern 5 formed in N well region 9 to a predetermined depth, an impurity diffusion region 6a is formed. In at least a part of the dummy patterns, there is left an N-type impurity diffusion region which constitutes the well region to reach the surface. In a portion from the upper surface of P well region 8 to a predetermined depth, an impurity diffusion region 6b is formed in dummy pattern 5. There is also left a P-type impurity diffusion region which constitutes the well region to reach the surface in at least a part of the dummy patterns. Further, a refractory metal silicide film 15 is formed on the surfaces of element formation region pattern 4 and dummy pattern 5.

According to such an arrangement, the potential of refractory metal silicide film 15 formed on dummy pattern 5 can be fixed at the same potential as that of N well region 9 or P well region 8 by the portion constituting the well region and left at the upper surface of dummy pattern 5 except for the impurity diffusion regions 6a and 6b. In addition, the potential of refractory metal silicide film 15 formed on element formation region pattern 4 can be fixed at the same potential as that of P well region 8 or N well region 9 by the portion constituting the well region and left at the upper surface of element formation region pattern 4 except for N$^+$ diffusion regions 10a and 10b and P$^+$ diffusion regions 11a and 11b. As a result, particular noises due to the CMOS structure can be reduced. Specifically, in such a structure, the surfaces of element formation region pattern 4 and dummy pattern 5 can be fixed at the same potential as that of P well region 8 or N well region 9, so that it is possible to prevent occurrence of potential difference between element formation region pattern 4 and dummy pattern 5 in each of P well region 8 or N well region 9. As a result, potential difference in P well region 8 or N well region 9 can be prevented, and the latchup phenomenon which causes electric current to flow through PN junction surface due to potential difference can be avoided.

As shown in FIG. 16, if opening patterns 14a and 14b for producing impurity diffusion regions 6a and 6b are formed in the same impurity injection mask as the mask having opening patterns 12a, 12b, 13a and 13b for producing source and drain regions in the same well region such that the opening patterns have the dimensions that are uniformly smaller than element formation region pattern 4 and dummy pattern 5, design is simple and the potential of the surface of the dummy pattern 5 can be fixed without additional processes.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A semiconductor device comprising, in a predetermined region of a major surface of a semiconductor substrate, an element formation region pattern and an element isolation region isolating the element formation region pattern, said element isolation region being divided into a plurality of cell regions including respective dummy patterns, a ratio of area occupied by the element formation region pattern being defined as the ratio of the area of said element formation region pattern sized according to a manner of forming an insulating film that is buried in said element isolation region to the area of said predetermined region, a ratio of area occupied by a dummy pattern being defined as the ratio of the area of said dummy pattern sized according to a manner of forming an insulating film that is buried in said element isolation region to the area of cell region including said dummy pattern, and a proportion of said ratio of area occupied by the dummy pattern to said ratio of area occupied by the element formation region pattern being set at a value in a range that causes no step of significance resulting from CMP.

2. The semiconductor device according to claim 1, wherein the insulating film buried in said element isolation region is formed:

(a) by repetition of etching and deposition, and a sizing amount (x) corresponding to a predetermined dimension measured from the outer periphery of the element formation region pattern is equal to t×n, wherein n is about 0.5 and t is the depth of an isolation trench; or (b) in conformal shape, and the sizing amount x is equal to 2×Cos (Sin$^{-1}$ (n)).

3. The semiconductor device according to claim 2, wherein said proportion is 80% to 120%.

4. The semiconductor device according to claim 1, wherein said ratio of area occupied by said element formation region pattern is highest is a memory cell region.

5. The semiconductor device according to claim 1, wherein proportion ranges from 80% to 120%.

6. The semiconductor device according to claim 1, wherein said dummy pattern formed in one predetermined cell region includes at least one rectangle.

7. The semiconductor device according to claim 1, wherein said dummy pattern located at a boundary between impurity diffusion regions of different conductivity types is removed.

8. The semiconductor device according to claim 1, wherein said dummy pattern located at a predetermined distance from a predetermined conductive layer is removed.

9. The semiconductor device according to claim 1, wherein said dummy pattern is formed by etching said semiconductor substrate to leave a main surface of said semiconductor substrate.

10. The semiconductor device according to claim 1, wherein said ratio of area occupied by said dummy pattern to said area of the cell region including said dummy region in a region within 50 μm in a plan view from an outer periphery of an alignment mark is defined to be smaller by at least 20% than that in a region not within 50 μm in plan view from the outer periphery of the alignment mark.

11. The semiconductor device according to claim 1, further comprising a conductive layer formed on said element formation region pattern and a dummy conductive layer formed on said dummy pattern with the same material and thickness as those of said conductive layer.

12. The semiconductor device according to claim 1, wherein a first conductive layer formed at a main surface of said dummy pattern and a second conductive layer formed at a main surface of said element formation region pattern are electrically connected by a well such that said first and second conductive layers are at the same potential in the same well.

13. A semiconductor device comprising, in each of a plurality of predetermined regions of a major surface of a semiconductor substrate, an element formation region pattern and an element isolation region isolating said element formation region pattern, said element isolation region being divided into a plurality of cell regions including respective dummy patterns, a ratio of area occupied by the element formation region pattern being defined as the ratio of the area of said element formation region pattern sized according to a manner of forming an insulating film that is buried in said element isolation region to the area of each of said predetermined regions, a ratio of area occupied by a dummy pattern being defined as the ratio of the area of said dummy pattern sized according to a manner of forming an insulating film that is buried in said element isolation region to the area of the cell region including said dummy pattern, and a proportion of said ratio of area occupied by the dummy pattern to an average of respective ratios of areas occupied by respective element formation region patterns of all said predetermined regions being set at a value in a range that causes no step of significance resulting from CMP.

14. The semiconductor device according to claim 13, wherein the insulating film buried in said element isolation region is formed:

(a) by repetition of etching and deposition, and a sizing amount (x) corresponding to a predetermined dimension measured from the outer periphery of the element formation region pattern is equal to t×n, wherein n is about 0.5 and t is the depth of an isolation trench; or (b) in conformal shape, and the sizing amount x is equal to $2 \times \cos(\sin^{-1}(n))$.

15. The semiconductor device according to claim 14, wherein said proportion is 80% to 120%.

16. The semiconductor device according to claim 13, wherein said ratio of area occupied by said element formation region pattern is highest is a memory cell region.

17. The semiconductor device according to claim 13, wherein said proportion ranges from 80% to 120%.

18. The semiconductor device according to claim 13, wherein said dummy pattern formed in one predetermined cell region includes at least one rectangle.

19. The semiconductor device according to claim 13, wherein said dummy pattern located at a boundary between impurity diffusion regions of different conductivity types is removed.

20. The semiconductor device according to claim 13, wherein said dummy pattern located at a predetermined distance from a predetermined conductive layer is removed.

21. The semiconductor device according to claim 13, wherein said dummy pattern is formed by etching said semiconductor substrate to leave a main surface of said semiconductor substrate.

22. The semiconductor device according to claim 13, wherein said ratio of area occupied by said dummy pattern to said area of the cell region including said dummy region in a region within 50 μm in a plan view from an outer periphery of an alignment mark is defined to be smaller by at least 20% than that in a region not within 50 μm in plan view from the outer periphery of the alignment mark.

23. The semiconductor device according to claim 13, further comprising a conductive layer formed on said element formation region pattern and a dummy conductive layer formed on said dummy pattern with the same material and thickness as those of said conductive layer.

24. The semiconductor device according to claim 13, wherein a first conductive layer formed at a main surface of said dummy pattern and a second conductive layer formed at a main surface of said element formation region pattern are electrically connected by a well such that said first and second conductive layers are at the same potential in the same well.

25. A semiconductor device comprising in each of a plurality of predetermined regions of a major surface of a semiconductor substrate, an element formation region pattern and an element isolation region isolating said element formation region pattern, said element isolation region being divided into a plurality of cell regions including respective dummy patterns, a ratio of area occupied by the element formation region pattern being defined as the ratio of the area of said element formation region pattern sized according to a manner of forming an insulating film that is buried in said element isolation region to the area of each of said predetermined regions, a ratio of area occupied by a dummy pattern being defined as ratio of the area of said dummy pattern sized according to a manner of forming an insulating film that is buried in said element isolation region to the area of the cell region including said dummy pattern, and a proportion of said ratio of area occupied by the dummy pattern to a maximum or respective ratios of areas occupied by respective element formation regions of all said predetermined region patterns being set at a value in a range that causes no step of significance resulting from CMP.

26. The semiconductor device according to claim 25, wherein the insulating film buried in said element isolation region is formed:

(a) by repetition of etching and deposition, and a sizing amount (x) corresponding to a predetermined dimension measured from the outer periphery of the element formation region pattern is equal to t×n, wherein n is about 0.5 and t is the depth of an isolation trench; or (b) in conformal shape, and the sizing amount x is equal to $2 \times \cos(\sin^{-1}(n))$.

27. The semiconductor device according to claim 26, wherein said proportion is 80% to 120%.

28. The semiconductor device according to claim 26, wherein said ratio of area occupied by said element formation region pattern is highest is a memory cell region.

29. The semiconductor device according to claim 26, wherein said proportion ranges from 80% to 120%.

30. The semiconductor device according to claim 25, wherein said dummy pattern formed in one predetermined cell region includes at least one rectangle.

31. The semiconductor device according to claim 25, wherein said dummy pattern located at a boundary between impurity diffusion regions of different conductivity types is removed.

32. The semiconductor device according to claim 25, wherein said dummy pattern located at a predetermined distance from a predetermined conductive layer is removed.

33. The semiconductor device according to claim 25, wherein said dummy pattern is formed by etching said semiconductor substrate to leave a main surface of said semiconductor substrate.

34. The semiconductor device according to claim 25, wherein said ratio of area occupied by said dummy pattern to said area of the cell region including said dummy region in a region within 50 µm in a plan view from an outer periphery of an alignment mark is defined to be smaller by at least 20% than that in a region not within 50 µm in plan view from the outer periphery of the alignment mark.

35. The semiconductor device according to claim 25, further comprising a conductive layer formed on said element formation region pattern and a dummy conductive layer formed on said dummy pattern with the same material and thickness as those of said conductive layer.

36. The semiconductor device according to claim 25, wherein a first conductive layer formed at a main surface of said dummy pattern and a second conductive layer formed at a main surface of said element formation region pattern are electrically connected by a well such that said first and second conductive layers are at the same potential in the same well.

* * * * *